United States Patent [19]

Takata

[11] Patent Number: 5,210,448

[45] Date of Patent: May 11, 1993

[54] PROGRAMMABLE LOGIC DEVICE

[75] Inventor: Akira Takata, Amagasaki, Japan

[73] Assignee: Ricoh Company, Ltd., Tokyo, Japan

[21] Appl. No.: 713,736

[22] Filed: Jun. 11, 1991

[30] Foreign Application Priority Data

Jun. 13, 1990 [JP] Japan .................. 2-156524

[51] Int. Cl.⁵ .................. H03K 19/173; G06F 7/38
[52] U.S. Cl. .................. 307/465.1; 307/465; 364/716
[58] Field of Search .................. 307/465, 465.1, 303.1, 307/482.1; 364/716, 784, 491; 365/189.12

[56] References Cited

U.S. PATENT DOCUMENTS

| | | | |
|---|---|---|---|
| 4,745,579 | 5/1988 | Mead et al. | 307/465 |
| 4,876,466 | 10/1989 | Kondou et al. | 307/465 |
| 4,902,515 | 4/1990 | Obata | 307/465 |
| 5,072,137 | 12/1991 | Slemmer | 307/465 |

Primary Examiner—David R. Hudspeth
Assistant Examiner—Richard Roseen
Attorney, Agent, or Firm—Cooper & Dunham

[57] ABSTRACT

A programmable logic device includes wordlines each having two sides for connection, bitlines substantially intersecting with the wordlines constituting an AND array portion in conjunction with the wordlines and a plurality of nonvolatile memory elements. Each nonvolatile memory element has data memorized therein and is connected to one of the wordlines and one of the bitlines. And the device has an OR array portion which conducts a predetermined calculation on the basis of the data read from the memory element, an input buffer circuit connected to one side of the wordlines and a decoder connected to the other side of the wordlines through a wordline driver.

11 Claims, 6 Drawing Sheets

PROGRAMMABLE LOGIC DEVICE

BACKGROUND OF THE INVENTION

1. Field of the Invention

The present invention relates to a programmable logic device which is referred to as PLD hereinafter.

2. Description of the Related Art

A PLD comprises AND circuits and OR circuits combined together to constitute various kinds of logic circuits.

The PLD of prior art has a relatively large dead space due to the structure thereof so that the mount for the circuit is no efficiently used for the chip layout arrangement.

Also, in the process for producing the PLD of the prior art, when the produced PLD is to be tested after sealing with plastic, the signal path at the time of testing is different from that at the time of actual use of the PLD. As a result, though it is possible to detect a defective memory cell on the basis of the difference of the relative delay time, it is difficult to detect the speed of the device at the time of actual use.

SUMMARY OF THE INVENTION

It is therefore an object of the present invention to provide a PLD which obviates the above-mentioned problems and makes it possible to shorten the delay time thereof as well as arrange the chips efficiently in a given space.

Further, the present invention aims at providing a PLD which enables at the time of testing thereof to detect the speed in actual use as well as the defective memory cells.

The above-mentioned objects of the present invention can be achieved by a programmable logic device comprising:

wordlines, each having two sides for connection;

bitlines substantially intersecting with the wordlines constituting an AND array portion in conjunction with the wordlines;

a plurality of non-volatile memory elements, each having data memorized therein and being connected to one of the wordlines and one of the bitlines;

an OR array portion which conducts a predetermined calculation on the basis of the data read from the memory element;

an input buffer circuit connected to one side of the wordline; and a decoder connected to the other side of the wordlines through a wordline driver.

In accordance with the present invention, the buffer is completely separated from the wordline drive inverter and the decoder by wordlines interposed therebetween, which makes it possible to directly connect to the memory array the logic circuit which is especially desirable to have a shortened delay time.

Therefore, it is an advantage of the present invention that the unnecessary parasitic capacity and inverter can be removed so that the delay time can be remarkably shortened, which makes it possible to heighten the function speed of the device.

It is another advantage of the present invention that the circuit layout can be arranged independently and evenly in each of both sides of the memory array, which makes it possible to reduce the wiring area and the dead space of the chip, resulting that the layout can be efficiently achieved and the chip becomes small.

Besides, in accordance with the present invention, it becomes possible to almost equalize the signal path at the time of test mode to that of the logic mode.

Therefore, it is a further advantage of the present invention that it becomes possible to accurately measure the input and output delay time at the time of actual use of the circuit by the test mode during the producing step.

Further objects and advantages of the present invention will be apparent from the following description of the preferred embodiments of the invention as illustrated in the accompanying drawings.

DESCRIPTION OF THE PREFERRED EMBODIMENTS

Figure 1:
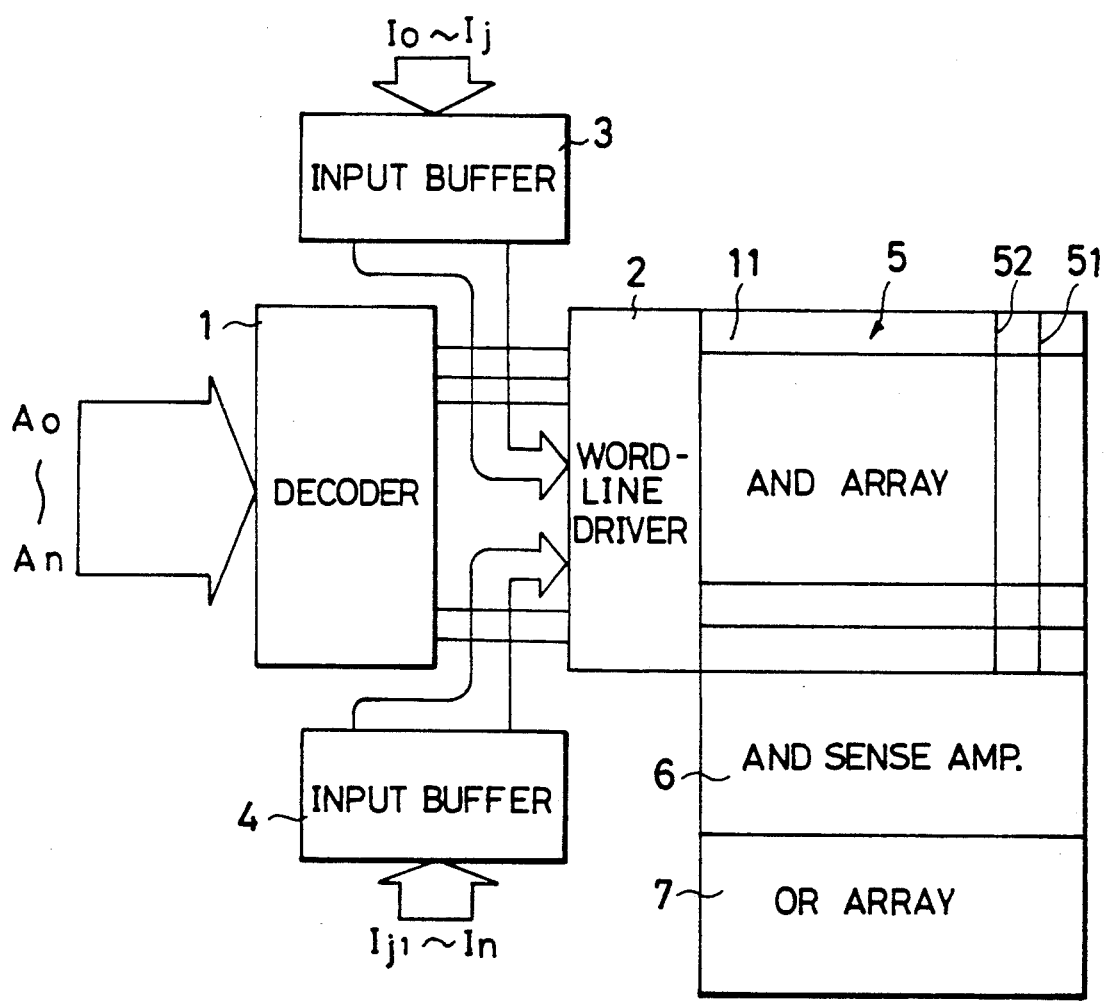
FIG. 1 is a block diagram of an example of the PLD according to the related art.

Embodiments of the present invention are described in detail hereinafter with reference to the drawings and in comparison to the related art which is also described referring to the drawings.

FIG. 1 illustrates a block diagram of a PLD. In FIG. 1, X address signals Ao to An are input to an X decoder 1. The X decoder 1 decodes the X address signals to wordline signals and outputs the decoded signals to a wordline driver 2.

Also, the outputs Io to Ij and Ij1 to In from input data terminals are transmitted to input buffers 3 and 4, respectively. The input buffers 3 and 4 amplify the input data and output the amplified data to the wordline driver 2.

It is to be noted that the signals from the X decoder 1 and the input buffers 3 and 4 are temporarily input to a switching circuit (not shown) which selects a data on the basis of the switching signal. The selected signal is transmitted to the wordline driver 2. The wordline driver 2 amplifies the input data and outputs the amplified data to wordlines 11 of an AND array unit 5.

On the other hand, a not shown Y decoder decodes Y address signals to bitline control signals which are transmitted to respective bitlines 51, 52, . . .

At each cross point of the wordline and the bitline is disposed an EPROM or an EEPROM which is an electrically programmable read only memory. The bitlines 51 . . . are connected to an OR array unit 7 through a sense amplifier 6.

Figure 2:
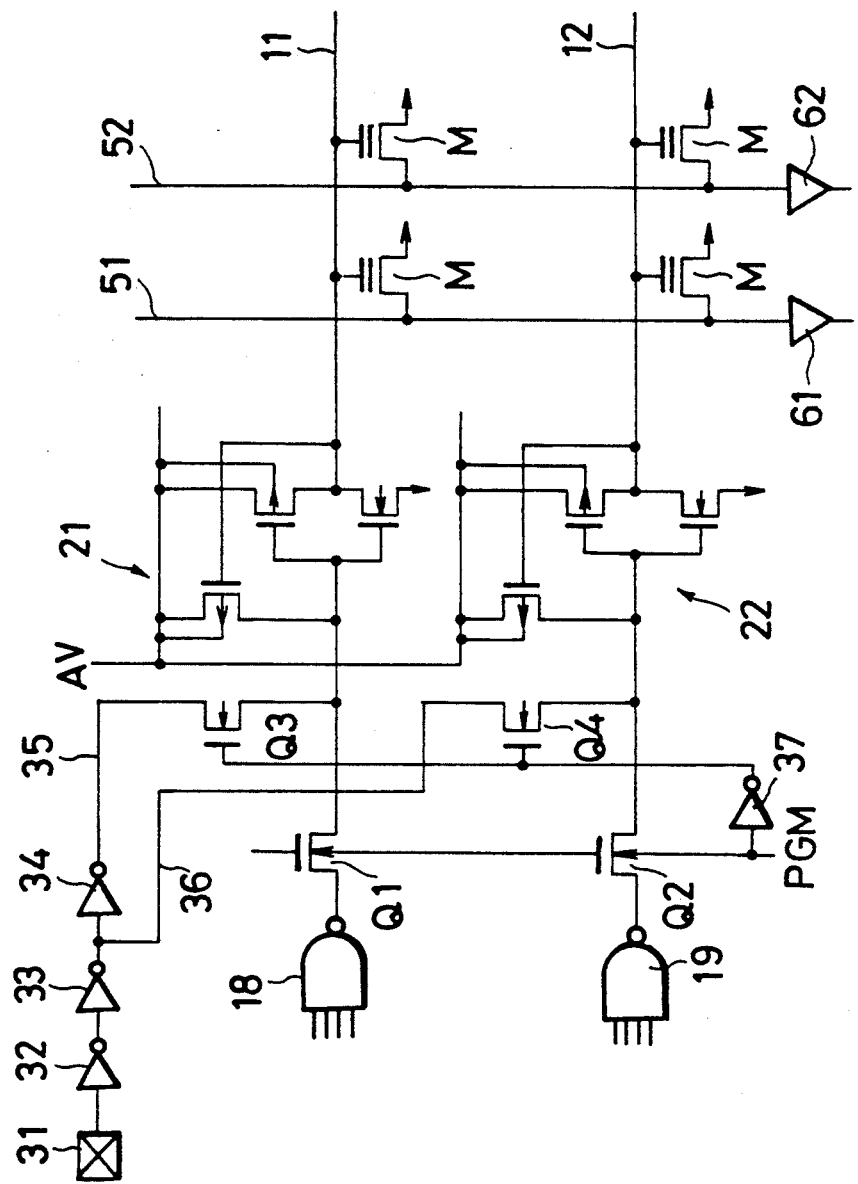
FIG. 2 is a circuit diagram of the main portion of the PLD of FIG. 1.

FIG. 2 illustrates a circuit diagram of the main portion of the PLD of FIG. 1. The circuit diagram represents a relation between a pair of wordlines 11 and 12.

In FIG. 2, two wordlines 11 and 12 are connected to an input terminal 31. The wordline 12 is connected to the terminal 31 through two inverters 32 and 33 which are used as input buffer means while the other wordline 11 is connected to the terminal 31 through three inverters 32, 33 and 34 as an input buffer means. Therefore, the two wordlines 11 and 12 are driven by opposite signals, respectively.

To each wordline 11, 12 is connected a feedback inverter 21, 22 which is used as wordline drive means. To each wordline 11, 12 is transmitted a decoded X address signal which is decoded by a NAND circuit 18, 19. Between each NAND circuit 18, 19 and the wordline 11, 12 is connected an N-channel MOS field effect transistor (referred to as NMOSFET hereinafter) Q1, Q2 which is used as a gate means. Also, a gate NMOSFET Q3, Q4 is connected between each of a pair of output lines 35 and 36 of the terminal 31 and each wordline 11, 12.

To the NMOSFET Q1, Q2 is input a programmable signal PGM which is "H" level at the time of programming. On the other hand, to the NMOSFET Q3, Q4 is input an inverted PGM signal which is inverted by the inverter 37.

Also, a voltage applying terminal is connected to each wordline 11, 12 through the feedback inverter 21, 22.

The PLD essentially has two modes, one being a program mode for writing a program in a memory element, while the other being a logic mode in which the PLD logically functions as an AND-OR circuit.

In the program mode, an "H" level signal is supplied to the PGM and a program voltage Vpp, for example +12.5 V, is applied to the terminal AV.

Since the "H" signal is transmitted to the NMOSFETs Q1 and Q2 from the PGM, the transistors Q1 and Q2 are turned on so that each NAND circuit 18, 19 is connected to each wordline 11, 12, as a result of which an address signal is transmitted to the wordline 11, 12.

On the other hand, to each gate of the NMOSFETs Q3 and Q4 is transmitted an inverter signal of PGM so that the transistors Q3 and Q4 are turned off, as a result of which the wordlines 11 and 12 are disconnected from the terminal 31. The feedback inverter 21 and 22 change the voltage level of the address signal transmitted to the wordlines 11 and 12 to the voltage of the program.

The not shown Y decoder selects a cross point of a bitline and a wordline where a memory element M comprising an EPROM and an EEPROM is disposed, to which element M is applied a program voltage (+12.5 V) so that the EPROM is always programmed as being "off".

On the other hand, with regard to the not programmed memory elements M, in the logic mode, the elements are changed from being "off" to "on" only when a wordline signal over a threshold level of, for example +5 V, is applied to the gate of each wordline.

A predetermined logic circuit is constituted by programming the memory elements M is mentioned above.

Also, in the logic mode, for example +5 V of Vcc is applied to the terminal AV. Also, an "L" level signal is applied to the PGM so that the NMOSFETs are turned off, as a result of which the NAND circuits 18 and 19 are disconnected from the wordlines 11 and 12, respectively. On the other hand, the NMOSFETs Q3 and Q4 connected to the input terminal 31 are turned on so that the word lines 11 and 12 are driven by the inverted signal of the input signal transmitted from the terminal 31.

In accordance with the way mentioned above, in response to the state of the memory element M at a selected cross point of the wordline and bitline, the data is output from the bitline 51, 52 and transmitted to the OR array unit through the sense amplifier 61, 62.

On the other hand, with regard to the PLD mentioned above, one of the important characteristics of the programmable read only non-volatile memory is the ON current (Ion) which is the current run between the source and the drain at the time of being "on". If the current is not more than a predetermined level, the PLD malfunctions. Therefore, it is desirable to detect the memory element having the ON current below the predetermined level. For this purpose, a PLD circuit is used in conjunction with an AC test circuit which is able to measure AC characteristics such as the input and output delay time characteristic etc. prior to the state that the memory elements of the PLD are programmed.

Figure 3:
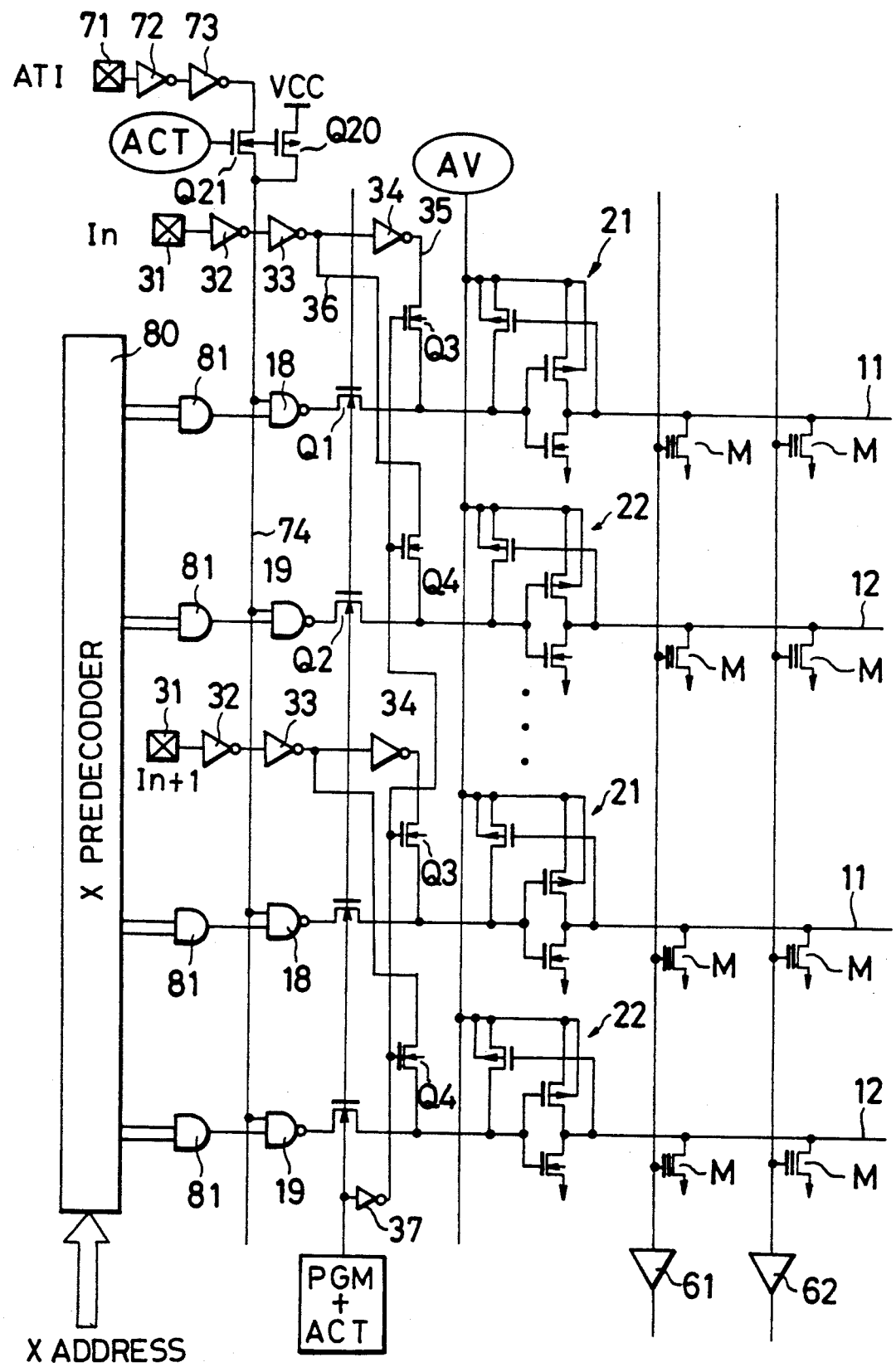
FIG. 3 is a circuit diagram of a PLD comprising a test circuit according to the related art.

FIG. 3 illustrates a PLD circuit comprising such an AC test circuit.

In FIG. 3, the same or corresponding parts are designated by the same numerals as the circuit of FIG. 2.

As illustrated in FIG. 3, the PLD comprises an essential structure wherein a logic mode signal and a wordline decode signal of the program mode are combined together before the wordline driver.

In this circuit structure, a test signal input line 74 is connected to one of the input terminals of the aforementioned NAND circuit 18, 19. The line 74 is connected to a test signal input terminal 71 through an NMOSFET Q21, a P-channel field effect MOS transistor (PMOSFET) Q20, and two inverters 72 and 73.

To the other input terminal of the NAND circuit 18, 19 is input a precoded X address signal predecoded by an X predecoder 80 through an AND circuit 81.

To the gate of the NMOSFET Q21 is input an ATC signal applied at the time of testing the device. Also, potential Vcc is applied to the source of the PMOSFET Q20.

At the time of test mode for measuring the AC characteristic of the device, the wordlines 11 and 12 are decoded and the non-elected wordlines are fixed to being the level "L" so that the selected wordline is driven to become "H" or "L" according to the signal from the test signal input terminal 71. For this purpose, the decoded signal of the wordline is multiplied by the test signal AT1 from the terminal 71 so as to select a wordline. After that, a bitline is selected so that the memory M at the position of the cross point of the selected lines is tested by conducting the on-off function.

In accordance with the PLD comprising the AC test circuit mentioned above, the AC path at the time of test (ACTEST) is constituted from the terminal 71 through the inverters 72 and 73, the NMOSFET Q21, the NAND circuit 18 and the MOSFET Q1 to the wordline. On the other hand, at the time of logic mode, the signal path is constituted from the terminal 31 through inverters 32, 33 and 34, and the NMOSFET Q3 to the wordline.

As mentioned above, the signal path at the time of AC test is different from that at the time of logic mode. As a result, the input and output delay time in actual use of the circuit, that is, in the logic mode becomes different from the delay time at the time of test operation. Therefore, the delay time in the actual use is determined from the correlation between the logic mode and the test mode.

In accordance with the above-mentioned PLD, the decode circuit of the program mode is changed to the input signal of the logic mode by the NMOSFETs Q1, Q2, Q3 and Q4 so that the signal is input to the wordline through the feedback inverter 21 and 22 used as common wordline drivers.

As a result, the whole structure of the circuit is disposed in one side of the memory array. Therefore, the wirings from the decoder and the input buffers cross each other between the decoder and the wordline driver, which increases the dead space in the device. Such a structure also results in inefficiency of using the space from the view point of layout of the whole chip the circuit.

Further, in the logic mode, the input signal is transmitted to the wordline through the wordline driver, which increases the delay time since the wordline driver often comprises a feedback inverter involving much delay time.

Also, the AC test mode is for checking the peripheral circuits such as memory circuits, input buffers and sense amplifiers without programming the memory cell after sealing the device with plastic material during the process of producing the PLD. In accordance with this test, it becomes possible to measure the input and output delay time for each memory cell without making a program for the memory cell.

However, in accordance with the above-mentioned structure of the test circuit, since the signal path in the actual use and the signal path in the test mode are different from each other, it is impossible to measure the speed in the actual use, though it is possible to detect the defective memory cells on the basis of correlation of the difference between the delay times.

The embodiments of the present invention described below obviates the above-mentioned problems.

A first embodiment of the present invention is described hereinafter with reference to FIGS. 4 and 5.

Figure 4:
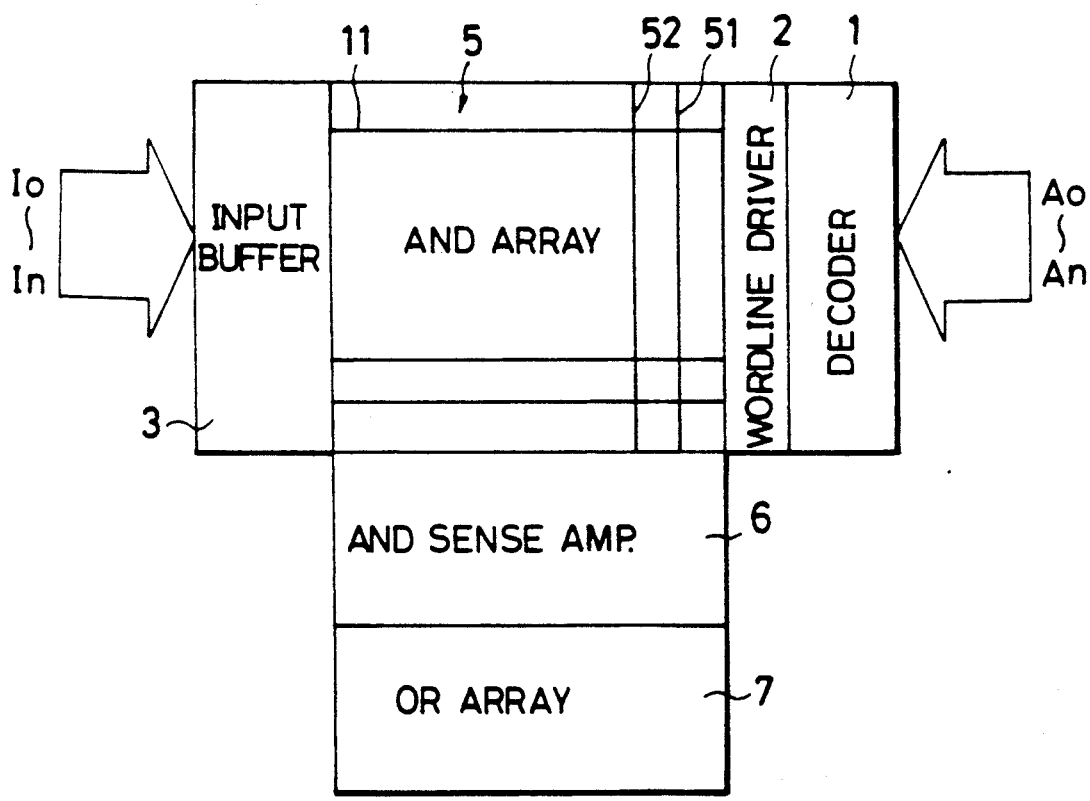
FIG. 4 is a block diagram of an embodiment of the PLD according to the present invention.

FIG. 4 illustrates a block diagram of the PLD of the present invention. And FIG. 5 illustrates a circuit diagram of the main portion of the PLD of FIG. 4. The same or corresponding parts are designated by the same numerals as the diagram of FIGS. 1 and 2.

The structure of this embodiment differs from that of FIGS. 1 and 2 in that the input buffer 3 of the logic system is independently disposed on the opposite side of the X decoder 1 and the wordline driver 2 of the program system with respect to the memory array 5.

In FIG. 4, X address signals Ao to An are input to the X decoder 1 which is connected to the wordline driver 2 which is, in this particular embodiment, disposed in and connected to the right side of the memory array 5. The X address signals are decoded to wordline signals by the decoder 1 and output to the wordline driver 2.

On the other hand, the output signal Io to In transmitted from the input data terminal are input to the input buffer 3 connected to the left side of the memory array 5, in this particular embodiment. The input buffer 3 amplifies the input data and output the data to the wordlines 11.

Also, with the use of a not shown Y decoder, the Y address signals are decoded to bitline control signals on the basis of which of each bitline 51 is driven.

At each cross point of the wordline 11 and the bitline 51 is disposed an electrically programmable read only memory such as EPROM or EEPROM. The bitlines 51 are connected to the OR array unit 7 through the sense amplifier 6.

Figure 5:
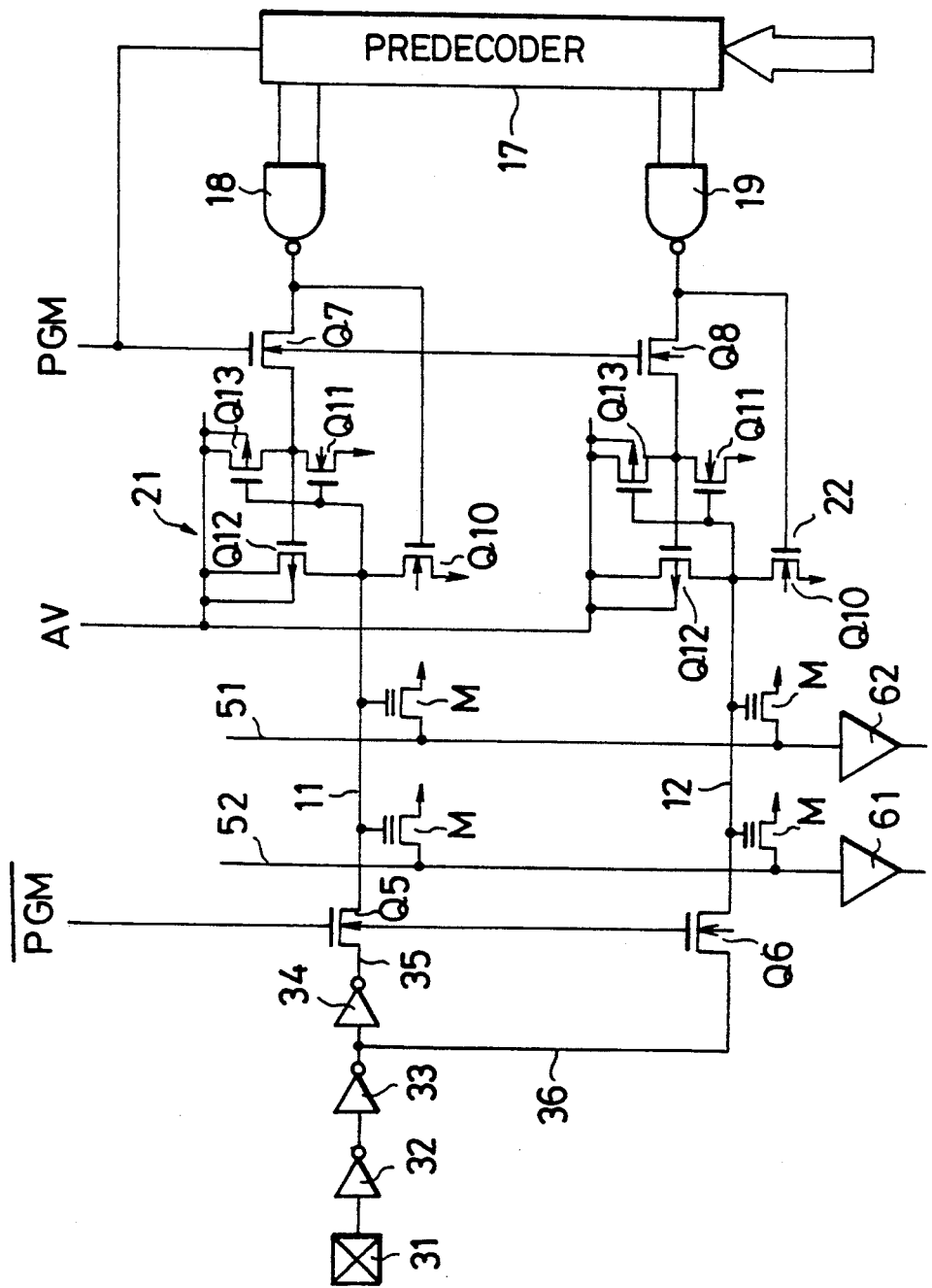
FIG. 5 is a circuit diagram of the main portion of the PLD of FIG. 4.

FIG. 5 illustrates the main portion of the PLD mentioned above and represents the relation between a pair of wordlines 11 and 12.

In FIG. 5, an input terminal 31 is connected to the left ends of the wordlines 11 and 12, respectively, each through an NMOSFET Q5, Q6. The output signal from the terminal 31 is transmitted to the wordline 12 through two inverters 32 and 33. While the output signal is transmitted to the other wordline 11 through three inverters 32, 33 and 34. Therefore, the wordlines 11 and 12 are driven by signals inversed from each other.

To the right end of each wordline 11, 12 is connected a feedback inverter 21, 22 which is used as a wordline driver. Further, to each inverter 21, 22 is connected a NAND circuit 18, 19. The circuit 18, 19 decodes the signal which is predecoded from the X address signal and transmits the signal to the inverter 21, 22. A gate NMOSFET Q7, Q8 is connected between the circuit 18, 19 and the inverter 21, 22.

The inverter 21, 22 comprises an NMOSFET Q10, Q11 and a PMOSFET Q12, Q13.

A program control signal (PGM) is transmitted to the NMOSFET Q7, Q8. While an inverted program control signal ($\overline{PGM}$) is transmitted to the NMOSFET Q5, Q6.

A voltage applying terminal AV is connected to the wordlines 11 and 12, respectively, through the inverter 21, 22.

The function of the above-mentioned circuit is as follows.

As mentioned before, the PLD has essentially two modes, one being a program mode for writing a program in a memory element and the other being a logic mode for performing a logic function of PLD as an AND-OR circuit. The two modes are changed by applying a program voltage Vpp to a programming power pin (input pin when in the logic mode).

First, in the program mode, a signal of "H" is supplied to the PGM while a signal of "L" is supplied to the $\overline{PGM}$. Also, the voltage Vpp, for example +12.5 V is applied to the terminal AV.

Since the "H" signal is applied to the NMOSFET Q7, Q8, the transistor is turned on so that the NAND circuit 18, 19 is connected to the inverter 21, 22.

On the other hand, since the "L" signal is applied to the gate of NMOSFET Q5, Q6, the transistor is turned off so that the terminal 31 is disconnected from the wordline 11, 12. Also, a decode signal is made by an X-predecoder 17 and the NAND circuits 18 and 19 in such a way that only the signal selected by the X address is arranged as "L" level while the other signals are arranged as "H" level. The decode signal is then changed to a Vpp signal by the drive circuit of the inverter 21, 22. In this case, the NMOSFET Q7, Q8 functions as a stopper for preventing the Vpp applied to the gate of the PMOSFET Q12, Q13 of the feedback inverter from being transmitted to the NAND circuit 18, 19 of 5 V.

The program voltage (+12.5 V) is applied to each memory element M comprising an EPROM and an EPROM disposed at each cross point of the bitlines selected by the Y decoder and the wordline 11, 12 so that the EPROM is always programmed as being "off".

On the other hand, the not programmed memory elements M are changed from "off" to "on" only when the wordline signal having voltage over the threshold level, for example 5 V, is applied to the gate, i.e., wordline, in the logic mode.

As mentioned above, a predetermined logic circuit is constituted by programming the memory elements.

Also, in the logic mode, Vcc of 5 V, for example, is applied to the terminal AV. Further, the PGM is supplied with the signal of "L" so that the NMOSFET Q7, Q8 is turned off so that the NAND circuit 18, 19 is disconnected from the wordline 11, 12. Also, the inverted $\overline{PGM}$ is supplied with the signal of "H" level so that the NMOSFET Q5, Q6 connected to the terminal 31 is turned on so that the wordlines 11 and 12 are driven by the signals inverted from each other. In this case, the FETs Q11, Q12 and Q13 of the inverter 21, 22 which is positioned in the opposite side of the wordline 11, 12 functions as a positive feedback circuit so that the changing speed of the wordline from "L" to "H" is raised, that is, the rising time is transmitted from the terminal 31 to the wordlines 11 and 12 without passing through the inverters 21 and 22, as a result of which the delay time is shortened.

Also, in response to the state of the memory element M at the cross point of the selected wordline and bitline, the data is output from the bitline 51, 52 to the OR array unit through the amplifier 61, 62.

Figure 6:
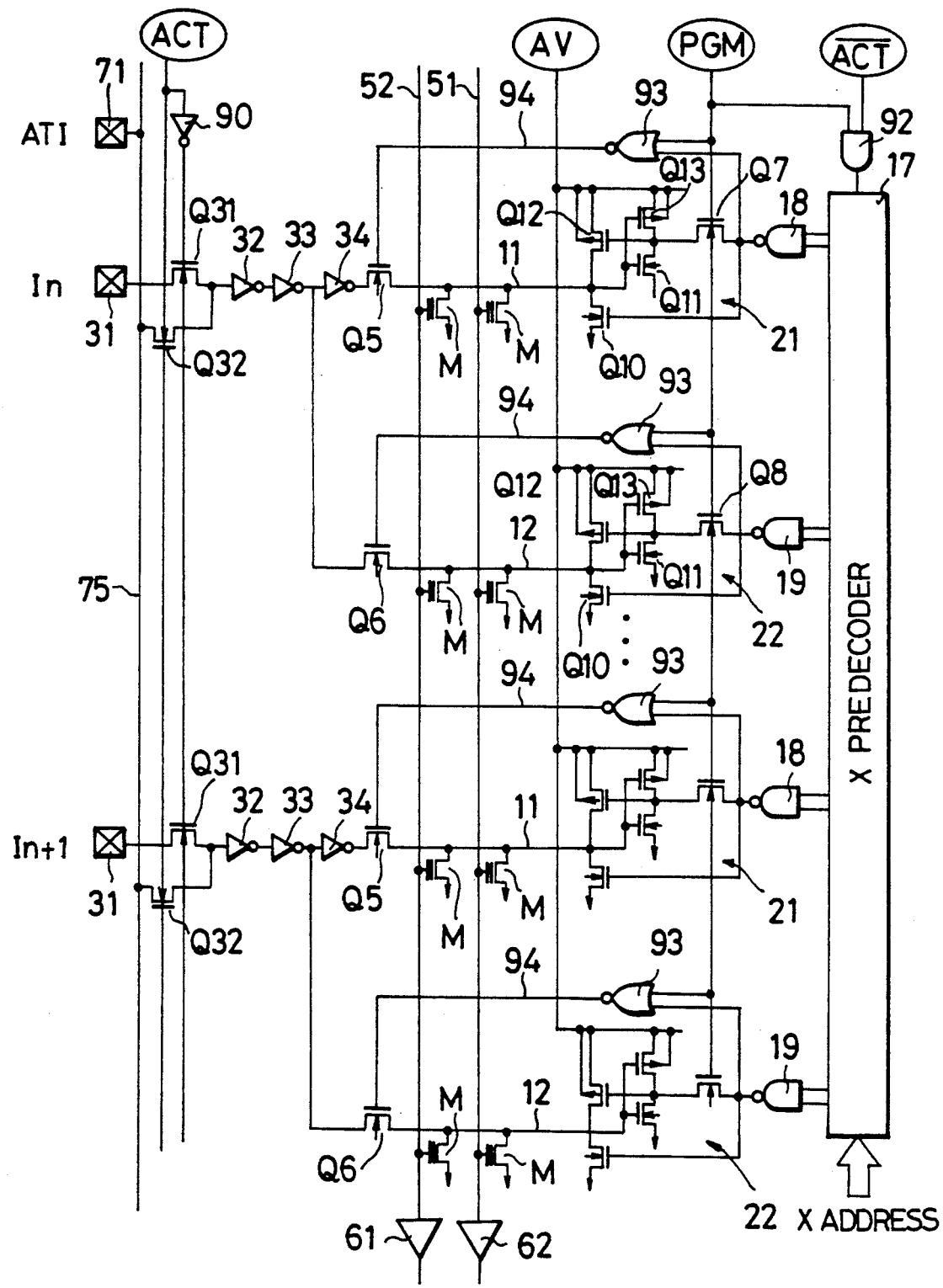
FIG. 6 is a circuit diagram of another embodiment of the PLD according to the present invention.

FIG. 6 illustrates another embodiment of the present invention. This embodiment comprises a test circuit added to the PLD of FIGS. 4 and 5.

In the embodiment of FIG. 6, at the time of logic mode for logic calculation of PLD and program mode for programming the non-volatile memory M, the "L" level signal is output from a not shown test control circuit as the test control signal (ACT). On the other hand, in the test mode, the test control signal (ACT) of "H" level is output to the test control line 75.

The terminal 31 is connected to the input buffer inverter 32 through an NMOSFET Q31 which functions as a gate. The signal ACT is transmitted to the gate of the FET Q31 through an inverter 90.

Also a test signal input line 74 of the terminal 71 is connected to the inverter 32 through the FET Q32 to which the signal ACT is transmitted as the control signal thereof.

On the other hand, an inverse signal $\overline{ACT}$ inverted from the control signal ACT is transmitted to the gate of the FET Q31 through an inverter 90.

Also, a test signal input line 74 of the terminal 71 is connected to the inverter 32 through the FET Q32 to which the signal ACT is transmitted as the control signal thereof.

On the other hand, an inverse signal $\overline{ACT}$ inverted from the control signal ACT is transmitted to one of the input terminals of the AND circuit 92. Also, the signal PGM is transmitted to the other of the input terminals of the circuit 92. The output of the circuit 92 is transmitted to the predecoder 17.

Further, a NOR gate 93 and an NMOSFET Q5, Q6 controlled by the output from the NOR gate 93 are arranged so that the arrangement is controlled by the signal ACT and that the wordline 11, 12 becomes disabled ("L" level, actually) for the signal transmitted from the NAND circuit 18, 19. The signal PGM is input to one of the input terminals of the NOR gate 93. Also, the address signal decoded by the predecoder 17 as mentioned above is input to the other of the input terminals of the NOR gate 93 through the NAND circuit 18, 19. The output from the NOR gate 93 is transmitted to the gate of the FET Q5, Q6 through an output line 94.

The function of the second embodiment mentioned above is further described below.

The PLD of the second embodiment has three functional modes. The first mode is a progress mode for writing a program in the memory element. The second mode is a logic mode for performing a logic function of PLD as an AND-OR circuit. And the third mode is a test mode for conducting an AC test.

First, in the program mode, the PGM is supplied with a signal "H" and the ACT is supplied with a signal "L". Also, the program voltage Vpp, for example +13 V, is applied to the terminal AV. Since the "H" level signal is applied to the FET Q7, Q8, the transistor Q7, Q8 is turned on so that the NAND circuit 18, 19 connected to the predecoder 17 comes in connection with the inverter 21, 22.

On the other hand, since the "L" level signal is applied to the gate of the FET Q5, Q6 from the NOR gate 93, the transistor Q5, Q6 is turned off so that the terminals 31 and 71 are disconnected from the wordlines 11 and 12. Also, a decode signal is made by the X predecoder 17 and the NAND circuit 18, 19 so that the signal selected by the X address is arranged as "L" (0 V) while the other signals are arranged as "H" (5 V). The decode signal (0 V/5 V) is changed to the signal of Vpp level by the drive circuit of the inverter 21, 22.

Also, in the logic mode, the voltage Vcc, for example +5 V, is applied to the terminal AV. Further, the PGM and ACT are supplied with a signal of "L" level so that the FET Q7, Q8 is turned off. Thereby, the NAND circuit 18, 19 is disconnected from the wordline 11, 12. And, the signal ACT is inverted by the inverter 90 so that a signal of "H" level is applied to the FET Q31 so that the transistor Q31 of the terminal 31 is turned on. Thereby, the wordlines 11 and 12 are driven by inverse signal, respectively. In this case, the FETs Q11, Q12 and Q13 of each inverter 21, 22 which is arranged in the opposite side of the wordline 11, 12 function as a positive feedback circuit so that the changing speed of the wordline from the level "L" to "H" is raised, that is, the rising time of the wordline drive is shortened.

In the test mode for the AC test, the terminal AV is supplied with the Vcc, for example, +5 V and the PGM is supplied with the signal of level "L" while the ACT is supplied with the signal of level "H". Therefore, the FET Q31 is turned off while the FET Q32 is turned on so that the input terminal 71 is connected to the inverter 32.

On the other hand, since the PGM is supplied with the signal of "L", the FET Q7, Q8 is turned off so that the feedback inverter 21, 22 is disconnected from the predecoder 17 and the circuit 18, 19.

Also, the inverse signal $\overline{ACT}$ input to the AND circuit 92 is supplied with the signal of "L", which makes the predecoder 17 to carry out the decoding function.

In that case, only the output from the NAND circuit 18, 19 which is selected by the X address signal becomes the level "L" signal while the other signals are the level "H".

If the output from the NAND circuit 18, 19 is not "H", the output from the NOR gate 93 becomes "L" so that the FET Q5, Q6 is turned off while the FET Q10 is turned on, which fixes all of the unselected wordlines 11, 12 to be "L".

On the other hand, the selected wordline 11, 12 is driven by the inverter 33, 34, that is, by the inverse signal of the test signal transmitted from the terminal 71.

In that case, the difference of the signal path from that when in the logic mode is only that the signal is input from the terminal 71 in the test mode whereas the signal is input from the terminal 31 in the logic mode. Therefore, it becomes possible to measure beforehand the delay time in the actual use at the time of the AC test.

Many widely different embodiments of the present invention may be constructed without departing from the spirit and scope of the present invention. It should be understood that the present invention is not limited to the specific embodiments described in the specification, except as defined in the appended claims.

What is claimed is:

1. A programmable logic device comprising:
   an AND array provided with a plurality of wordlines, a plurality of bitlines substantially crossing with said plurality of wordlines, and a plurality of non-volatile memory elements, each of said memory elements having data memorized therein and being connected to one of said wordlines and one of said bitlines at each cross point of said bitlines and said wordlines, each of said wordlines having two opposed terminals;
   means for reading data from said plurality of non-volatile memory elements;
   an OR array for carrying out a predetermined calculation on the basis of data read from said plurality of non-volatile memory elements and coupled to said bitlines;
   an input buffer connected to one of said terminals of said wordlines;
   a wordline driver connected to the other of said terminals of said wordlines; and
   a decoder connected to the other of said terminals of said wordlines through said wordline driver, said wordline driver and said input buffer being at opposite sides of said AND array.

2. A programmable logic device according to claim 1, wherein said input buffer includes a plurality of inverters.

3. A programmable logic device according to claim 2, wherein said input buffer includes a plurality of input terminals, and each of said input terminals in connected to one of a pair of wordlines included in said plurality of wordlines through an odd number of inverters included in said plurality of inverters and is connected to the other of said pair of wordlines through an even number of inverters included in said plurality or inverters.

4. A programmable logic device operable in logic operation mode and in a program writing operation mode, said device comprising:
   an AND array provided with a plurality of wordlines, a plurality of bitlines substantially crossing with said plurality of wordlines, and a plurality of non-volatile memory elements, each of said memory elements having data memorized therein and being connected to one of said wordlines and one of said bitlines at a respective cross point of said bitlines and said wordlines, and a source of a program control signal, each of said wordlines having two opposed terminals and being driven when a program control signal from said source is supplied thereto;
   means for reading data from said plurality of non-volatile memory elements;
   an OR array for carrying out a predetermined calculation on the basis of data read from said plurality of non-volatile memory elements and coupled to said bitlines;
   an input buffer connected to the other of said terminals of said wordlines;
   a wordline driver connected to the other of said terminals of said wordlines;
   a decoder connected to the other of said terminals of said wordlines through said wordline driver, said wordline driver and said input buffer being at opposite sides of said AND array;
   first switching means which are open or closed selectively between said input buffer and said plurality of wordlines in response to a program control signal from said source;
   second switching means which are open or closed selectively between said decoder and said plurality of wordlines in response to a program control signal from said source; and
   a voltage applying terminal for applying voltages to said plurality of wordlines to switch said programmable logic device between said logic operation mode and said program writing operation mode.

5. A programmable logic device according to claim 4, wherein said input buffer includes a plurality of inverters.

6. A programmable logic device according to claim 5, wherein said input buffer includes a plurality of input terminals, and each of said input terminals in connected to one of a pair of wordlines included in said plurality of wordlines through an odd number of inverters included in said plurality of inverters and is connected to the other of said pair of wordlines through an even number of inverters included in said plurality or inverters.

7. A programmable logic device operable in logic operation mode and in a program writing operation mode, said device comprising:
   an AND array provided with a plurality of wordlines, a plurality of bitlines substantially crossing with said plurality of wordlines, and a plurality of non-volatile memory elements, each of said memory elements having data memorized therein and being connected to one of said wordlines and one of said bitlines at a respective cross point of said bitlines and said wordlines, and a source of a program control signal, each of said wordlines having two opposed terminals and being driven when a program control signal from said source is supplied thereto;
   means for reading data from said plurality of non-volatile memory elements;
   an OR array for carrying out a predetermined calculation on the basis of data read from said plurality of non-volatile memory elements and coupled to said bitlines;
   an input buffer connected to one of said terminals of said wordlines;
   a wordline driver connected to the other of said terminals of said wordlines, and said wordline driver including feedback inverters each comprising a plurality of transistors connected in an inverter arrangement functioning as a positive feedback circuit in the logic operation mode;
   a decoder connected to the other of said terminals of said wordlines through said wordline driver, said wordline driver and said input buffer being at opposite sides of said AND array;
   first switching means which are open or closed selectively between said input buffer and said plurality of wordlines in response to a program control signal from said source;
   second switching means which are open or closed selectively between said decoder and said plurality of wordlines in response to a program control signal from said source; and a voltage applying terminal for applying voltages to said plurality of wordlines to switch said programmable logic device between the logic operation mode and the program writing operation mode.

8. A programmable logic device according to claim 7, wherein said input buffer includes a plurality of inverters.

9. A programmable logic device according to claim 8, wherein said input buffer includes a plurality of input terminals, and each of said input terminals in connected to one of a pair of wordlines included in said plurality of wordlines through an odd number of inverters included in said plurality of inverters and is connected to the other of said pair of wordlines through an even number of inverters included in said plurality or inverters.

10. A programmable logic device operable in logic operation mode, in a program writing operation mode and in a test operation mode, said device comprising:

an AND array provided with a plurality of wordlines, a plurality of bitlines substantially crossing with said plurality of wordlines, and a plurality of non-volatile memory elements, each of said memory elements having data memorized therein and being connected to one of said wordlines and one of said bitlines at a respective cross point of said bitlines and said wordlines, and a source of a program control signal, each of said wordlines having two opposed terminals and being driven when a program control signal from said source is supplied thereto;

means for reading data from said plurality of non-volatile memory elements;

an OR array for carrying out a predetermined calculation on the basis of data read from said plurality of non-volatile memory elements and coupled to said bitlines;

an input buffer connected to one of said terminals of said wordlines;

a wordline driver connected to the other of said terminals of said wordlines;

a decoder connected to the other of said terminals of said wordlines through said wordline driver, said wordline driver and said input buffer being at opposite sides of said AND array;

first switching means which are open or closed selectively between said input buffer and said plurality of wordlines in response to a program control signal from said source;

second switching means which are open or closed selectively between said decoder and said plurality of wordlines in response to a program control signal from said source;

a voltage applying terminal for applying voltages to said plurality of wordlines to switch said programmable logic device between the logic operation mode and the program writing operation mode;

a source of a test control signal; and a test control terminal to which said test control signal is applied to cause the programmable logic device to operate in the test operation mode.

11. A programmable logic device according to claim 10, wherein said wordline driver includes feedback inverters each comprising a plurality of transistors connected in an inverter arrangement function as a positive feedback circuit in the logic operation mode.

* * * * *